(12) United States Patent
Takaya

(10) Patent No.: US 6,628,530 B2
(45) Date of Patent: Sep. 30, 2003

(54) SHIELDED CASE, ELECTRONIC DEVICE HAVING SHIELDED CASE, ELECTRONIC APPARATUS USING ELECTRONIC DEVICE, AND METHOD FOR MANUFACTURING SHIELDED CASE

(75) Inventor: Tadashi Takaya, Toyama (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 09/902,119

(22) Filed: Jul. 10, 2001

(65) Prior Publication Data
US 2002/0015295 A1 Feb. 7, 2002

(30) Foreign Application Priority Data
Jul. 28, 2000 (JP) .......................................... 2000-229751

(51) Int. Cl.[7] .................................................. H05K 9/00
(52) U.S. Cl. ...................... 361/816; 361/800; 361/818; 361/745; 174/35
(58) Field of Search ................................ 361/800, 816, 361/818, 745, 752; 174/35, 51 R

(56) References Cited

U.S. PATENT DOCUMENTS

| 5,354,951 | A  | * | 10/1994 | Lange et al. ............... 174/35 R |
| 5,883,791 | A  | * | 3/1999  | Deguchi ................ 248/220.22 |
| 6,194,653 | B1 | * | 2/2001  | McMiller et al. ...... 174/35 GC |
| 6,313,400 | B1 | * | 11/2001 | Mosquera et al. ........ 174/35 R |

FOREIGN PATENT DOCUMENTS

| JP | 02-52481   | 4/1990 |
| JP | 02-76880   | 6/1990 |
| JP | 08-130846  | 5/1996 |

* cited by examiner

Primary Examiner—David Martin
Assistant Examiner—Hung Bui
(74) Attorney, Agent, or Firm—Dickstein, Shapiro, Morin & Oshinsky, LLP.

(57) ABSTRACT

A shielded case includes a plurality of walls. At least one of the walls is formed by at least first and second separate sections which abut one another along an interface. A depression is formed in at least one of the first and second sections so as to cause at least one of said sections to expand toward the other of section thereby pressure-welding said first and second sections to one another along at least part of said interface.

11 Claims, 7 Drawing Sheets

US 6,628,530 B2

SHIELDED CASE, ELECTRONIC DEVICE HAVING SHIELDED CASE, ELECTRONIC APPARATUS USING ELECTRONIC DEVICE, AND METHOD FOR MANUFACTURING SHIELDED CASE

BACKGROUND OF THE INVENTION

1. Field of the Invention

The present invention relates to shielded cases designed to inhibit the transmission of electromagnetic waves, electronic devices using the shielded cases, electronic apparatuses using the electronic devices, and methods for manufacturing the shielded cases.

2. Description of the Related Art

FIG. 10 is a perspective view of a known shielded case 10 disclosed in, for example, Japanese Unexamined Patent Application Publication No. 2-52481.

Shielded case 10 is made of a metal or an insulative material coated with a metallic film and includes a top wall 12, a front wall 14, a rear wall 16 and a pair of side walls 18 and 20. The bottom 22 of the shielded case 10 is designed to be mounted on a circuit board and is open.

Shielded case 10 is formed by cutting a blank 24 (FIG. 3) having a predetermined shape from a single sheet of material and bending the sheet at substantially right angles along the dashed lines of FIG. 3 to form the walls 12–20. The two side walls 18, 20 are formed by half walls 18a, 18, and 20a, 20b, respectively. Each of the half walls extends from and is integral with a respective edge of the front or rear walls 14, 16.

Mating parts 18c and 18d are formed in the half walls 18a and 18b, respectively, and interlock with each other when assembled to form the side wall 18. Similarly, mating parts 20c and 20d are formed in the half walls 20a and 20b and interlock with when assembled to form the side wall 20. The half walls 18a and 18b are butt-jointed at their respective edges in such a manner that the mating parts 18c and 18d couple with each other. Similarly, the half walls 20a, 20b are butt-jointed at their respective edges in such a manner that the mating parts 20c and 20d couple with each other.

An electronic element (e.g., an oscillation circuit) which is likely to be affected by electromagnetic waves is typically housed in the shielded case to protect it from externally generated electromagnetic waves and to contain electromagnetic waves generated by the electronic element with the case.

Various types of electronic devices can be shielded using the foregoing shield. One such class of devices are sensors for determining the movement of an object (e.g., an oscillation gyro). Such sensors are subject to strong impacts which threaten the integrity of the shielded case.

The two mating pairs of half walls of the known shielded case 10 are held together by the interlocking relationship between the mating parts 18c, 18d and 20c, 20d, respectively. Because these mating parts only interlock with one another, there is a risk that they will separate when an external impact is applied to the shielded case. If this happens, a gap will be formed between the mating parts and the electronic element in the case will not be sufficiently shielded from electromagnetic waves.

One way to avoid this problem is to apply solder to the mating parts to more firmly couple them together. However, this requires an additional manufacturing step and creates a problem of environmental pollution because of the lead in the solder.

SUMMARY OF THE INVENTION

Accordingly, it is an object of the present invention to provide a shielded case in which the mating parts do not separate from each other even when an impact is applied to the shielded case.

It is another object of the present invention to provide a shielded case in which mating parts are not likely to separate from each other and in which gaps between the mating parts can be reduced without the use of solder.

To these ends, according to a first aspect of the present invention, a shielded case comprises:

a plurality of walls, at least one of the walls being formed by at least first and second separate sections which abut one another along an interface; and one or more depressions formed in at least one of the first and second sections so as to cause at least one of said sections to expand toward the other of said sections thereby pressure-welding said first and second sections along at least part of said interface.

In the shielded case according to the present invention, half walls are firmly coupled with each other by forming depressions in the half walls, whereby the half walls are not likely to separate from each other when an impact is applied.

In the shielded case according to the present invention, the half walls can be firmly coupled with each other without using solder, whereby a product free from lead can be provided.

In the shielded case according to the present invention, the half walls are coupled with each other without gaps therebetween, whereby electromagnetic waves inside can be prevented from leaking to the outside and the outside electronic waves can be reliably shielded.

The present invention is also directed towards a shielded electronic device comprising:

(A) a shielded case comprising:

(1) a plurality of walls, at least one of the walls being formed by at least first and second separate sections which abut one another along an interface; and (2) one or more depression formed in at least one of the first and second sections so as to cause at least one of said sections to expand toward the other of said sections thereby pressure-welding said first and second sections along at least part of said interface; and (B) an electronic component located in said shielded case.

In the electronic device according to the present invention, half walls of a shielded case are firmly coupled with each other, whereby a risk in that the sidewalls remove from each other and an electronic element received in the shielded case is exposed to the outside when an impact is applied is avoided.

An electronic circuit according to the present invention contains a plurality of components, at least one of said components being a shielded electronic device comprising:

(A) a shielded case comprising:

(1) a plurality of walls, at least one of the walls being formed by at least first and second separate sections which abut one another along an interface; and (2) one or more depression formed in at least one of the first and second sections so as to cause at least one of said sections to expand toward the other of said sections thereby pressure-welding said first and second sections along at least part of said interface; and (B) an electronic component located in said shielded case.

In the electronic apparatus according to the present invention, an electronic device is used, in which a risk that the half walls of a shielded case will separate from each other and expose an electronic element received in the shielded case to external electromagnetic radiation when an impact is applied to the case is avoided.

According to the method of the present invention, a method for manufacturing a shielded electronic device comprises:

forming a wall by bending first and second separate sections of a flat plate toward one another with opposed edges of said first and second sections abutting one another; and forming one or more depressions in said wall so that at least one of the first and second sections is expanded toward the other along an interface between said sections to pressure weld said sections together.

BRIEF DESCRIPTION OF THE DRAWINGS

Other features and advantages of the present invention will become apparent from the following description of the invention which refers to the accompanying drawings.

DETAILED DESCRIPTION OF EMBODIMENTS OF THE INVENTION

Figure 1:
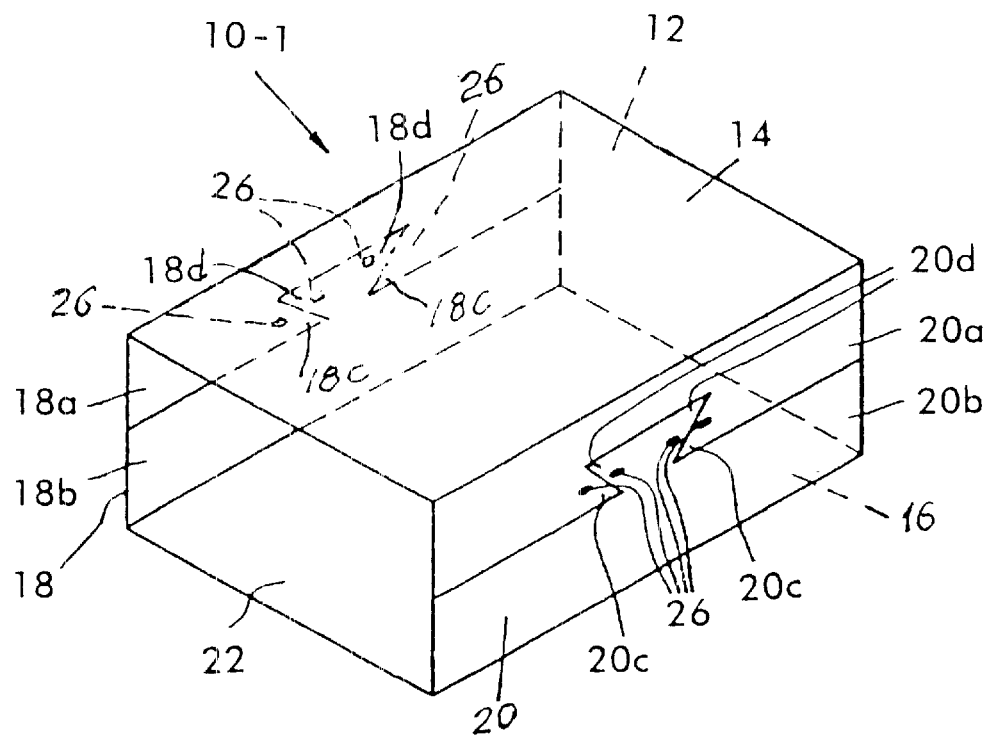
FIG. 1 is a perspective view of a shielded case according to a first embodiment of the present invention.
Figure 2:
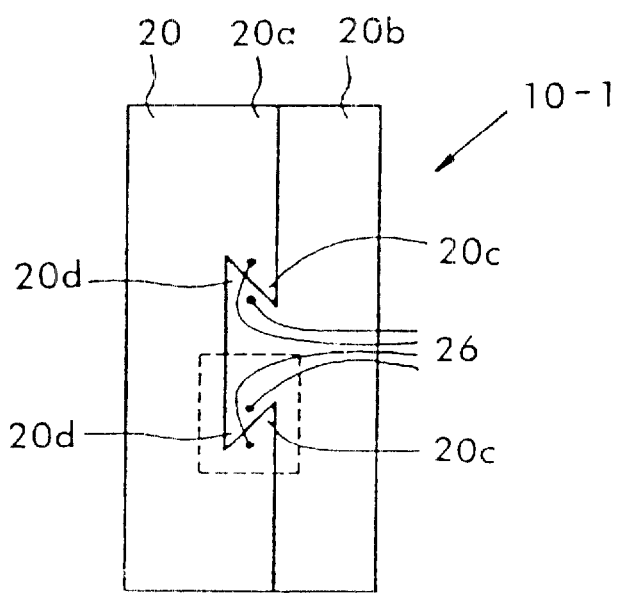
FIG. 2 is a side view of the shielded case shown in FIG. 1.

A first embodiment of the present invention is shown in FIGS. 1 through 5. Like the prior art shielded case 10, the shielded case 10-1 of the invention includes a top wall 12, a front wall 14, a rear wall 16 and a pair of side walls 18, 20. The basic structure of the first embodiment of the present invention is substantially the same as the prior art and will not be described again. The primary difference between the prior art and the first embodiment of the invention is that the blank 24 is made of a ductile material which is expanded in the area of mating parts 18c, 18d, 20c and 20c by a series of deformations formed in the ductile material in the area of the mating parts. In the embodiment shown in FIGS. 1 and 2, the deformations are circular depressions. These depressions expand the metallic material of which the case is formed causing the mating parts 18c and 18d and the mating parts 20c, 20d to be pressed against each other so as to pressure weld the parts together (i.e.,to have them adhere together). This causes the half walls 18a, 18b and the half walls 20a, 20b, respectively, to be strongly coupled together, thereby avoiding the gaping problem of the prior art.

Figure 3:
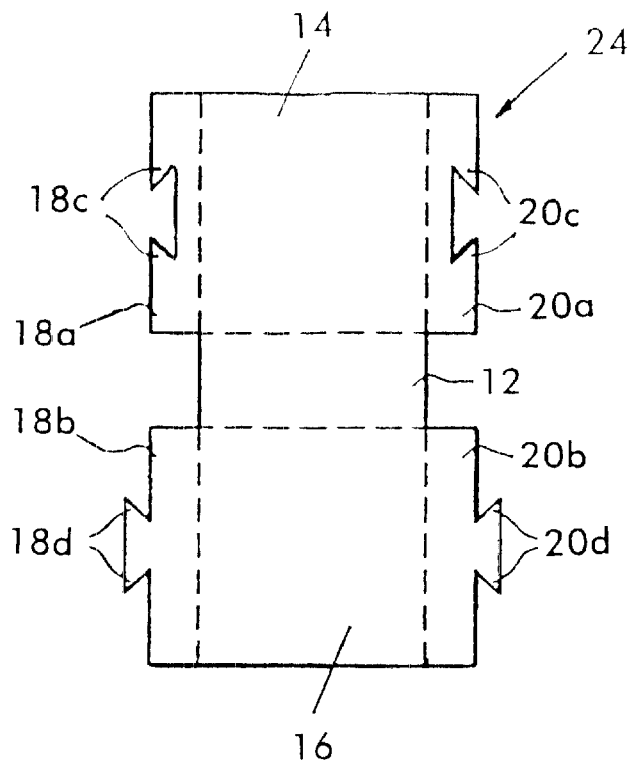
FIG. 3 is a development view of a blank from which the shielded case of both the invention and the prior art is formed.

Like the prior art, the shielded case 10-1 of the invention is preferably formed from a single blank 14 shown in FIG. 3. However, according to the invention, the blank 14 is preferably cut from a ductile plate (such as copper) to ensure that the interlocking portions of the side wall will expand when the depressions 26 are formed therein. The ductile plate preferably has a predetermined thickness and the blank 14 is preferably cut using a press or the like.

After the blank 14 has been cut, it is bent at substantially right angles along each of the dashed lines shown in FIG. 3 to form the walls 12–20 with the mating parts 18c, 18d and 20c and 20d interlocking with one another. As a result of this process, the half walls 18a and 18b are butt-jointed at their respective edges to form the side wall 18 and the half walls 20a and 20b are butt-jointed at their respective edges to form the side wall 20. As with the prior art, this is insufficient to avoid gapping between the adjacent half walls when a large external impact is applied to the case 10-1.

To avoid this problem, the present invention forms deformations in the side walls in the area of the mating parts to pressure weld, and thereby securely couple, the half walls together. In the present embodiment, this is achieved by forming circular depressions in the half walls 18a, 18b and 20a, 20b in the areas of the mating parts 18c, 18d and 20c, 20d. These depressions are formed using a press or other suitable apparatus (or by hand). This simple method securely couples the half walls together and avoids the problems of the prior art without the use of solder.

Figure 4:
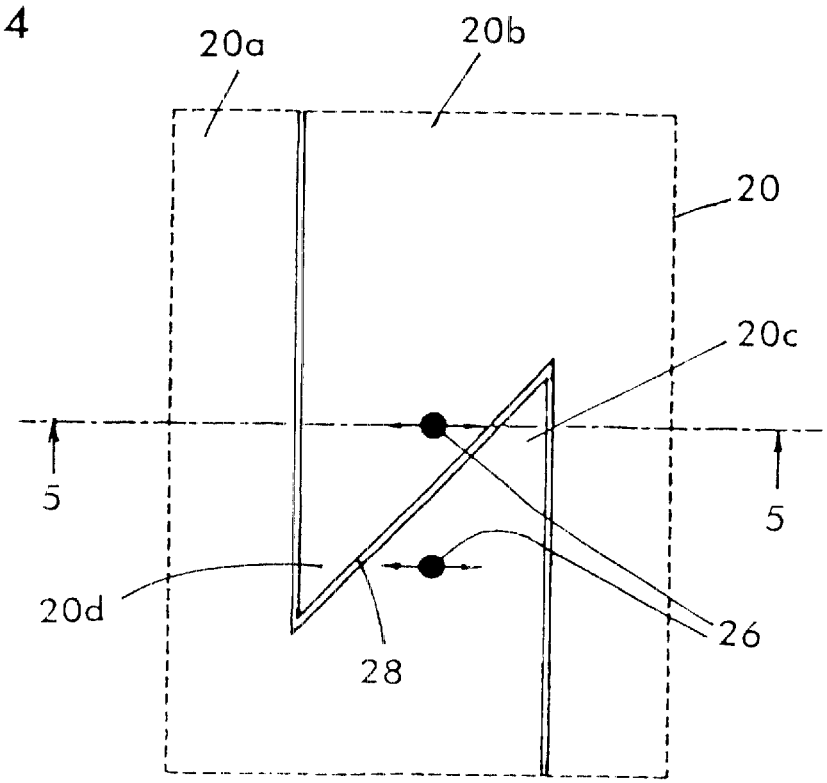
FIG. 4 is an enlarged view of a portion of the shielded case shown in FIG. 1.
Figure 5A:
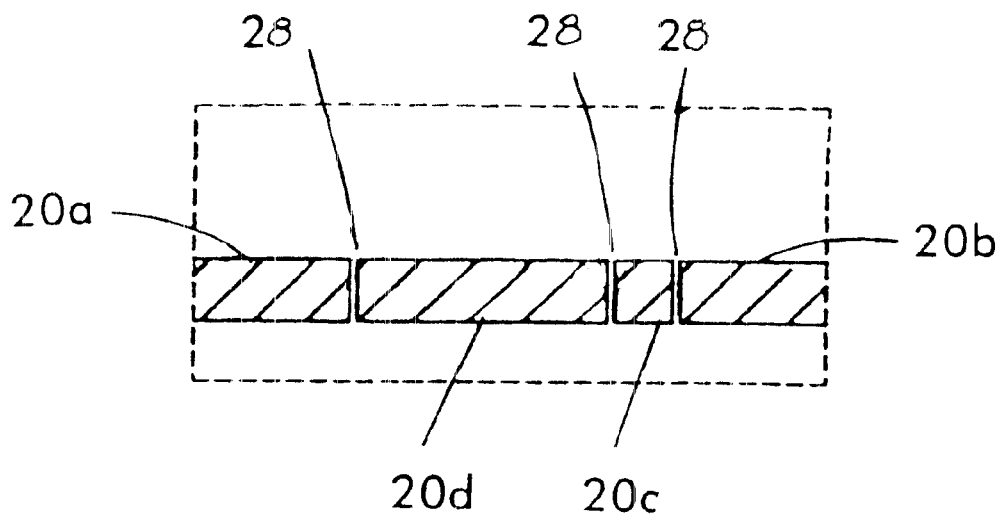
FIGS. 5A and 5B are sectional views taken along line 5—5 of FIG. 4.
Figure 5B:
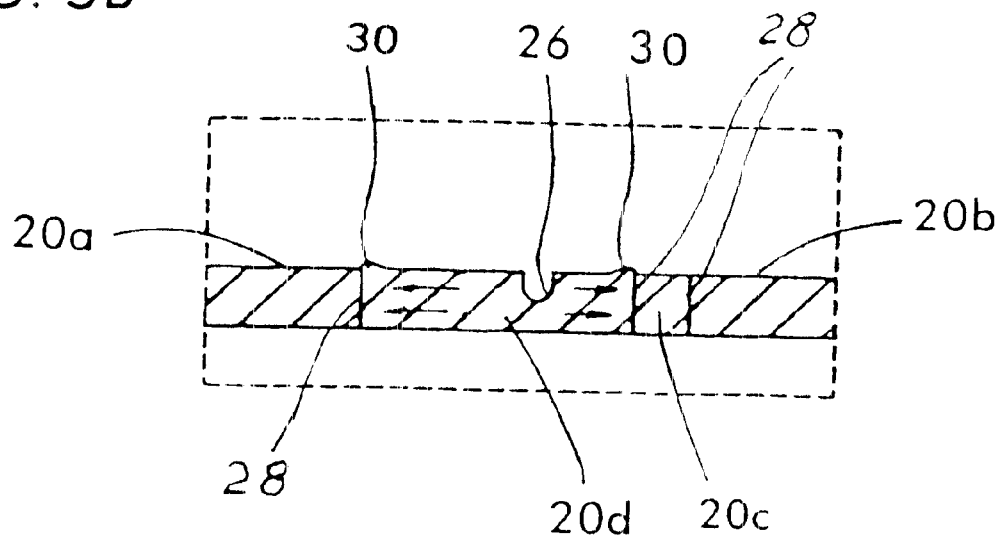

The manner in which the formation of the depressions 26 pressure-weld the mating parts together can best be understood with reference to FIGS. 4, 5A and 5B. FIG. 4 is an enlarged view of a portion of the front wall 14 enclosed by a dotted line, of the shielded case 10 shown in FIG. 2. FIG. 5A is a sectional view along line 5—5 of the portion of the shielded case 10-1 shown in FIG. 4 before the depression 26 is formed. FIG. 5B is a sectional view along the line 5—5 of the portion of the shielded case 10-1 shown in FIG. 4, after the depression 26 has been formed.

As best shown in FIG. 4, the mating portions 20c and 20d overlap each other in the area of the a Z-shaped interface 28 between the upper and lower half walls 20a and 20b. The depressions 26 are preferably formed in this overlapped area so that when the ductile material forming the case 10-1 expands (at least in the direction of the arrows in FIG. 4)the abutting portions of the Z-shaped interface 28 are forced into pressure contact with one another and are pressure-welded together. This effect can better be understood with reference to FIGS. 5A and 5B.

In FIG. 5A, the depression 26 has not yet been formed in the half wall 20b and there may be a small gap between the adjacent mating portions. Even if the mating portions are touching, they are not yet pressure welded. FIG. 5B shows the state of the mating portions once the depression 26 has been formed in the mating portion 20d. As shown by the arrows, the mating portion 20d expands outwardly toward the Z-shaped interface 28 causing the abutting edges to be pressure-welded. In the embodiment shown, the expansion caused by the depression 26 is large and projections 30 are created in the area of the Z-shaped interface 28. However, a smaller depression 26 can be formed so as to pressure-weld the abutting edges together without forming the projections 30.

The foregoing process is preferably carried out in the overlapping areas of all of the mating parts 18c, 18d, 20c and 20d so that the half walls 18a, 18b and the half walls 20a, 20b are firmly coupled together and do not separate from each other.

In the embodiment of FIGS. 1–5, a pair of circular depressions are formed in the area of each Z-shaped interface of a respective pair of mating parts. However, the number and location of the depressions, as well as the shape and the size of the depressions can be varied as desired.

The shielded case according to the present invention produces many advantages. It enables the half walls to be firmly coupled to one another without soldering, thereby providing a secure coupling without the use of lead. [While the preferred embodiment avoids the use of solder, solder can be used in addition to the formation of depressions if desired.]

Because the half walls are firmly coupled together without gaps therebetween, electromagnetic waves located inside the case do not leak to the outside, and the electromagnetic waves located outside the case do not penetrate into the shielded case.

By way of example and not limitation, several alternative designs for the shielded case are shown in FIGS. 6A, 6B, 6C, 6D, and 6E. In these Figures only side wall 20 is shown. Each side wall 18 will preferably have the same structure as the side wall 20 shown. The remaining structure of the shielded cases of FIGS. 6A to 6E are the same as that of FIG. 1 and a description of these components is not provided.

Figure 6A:
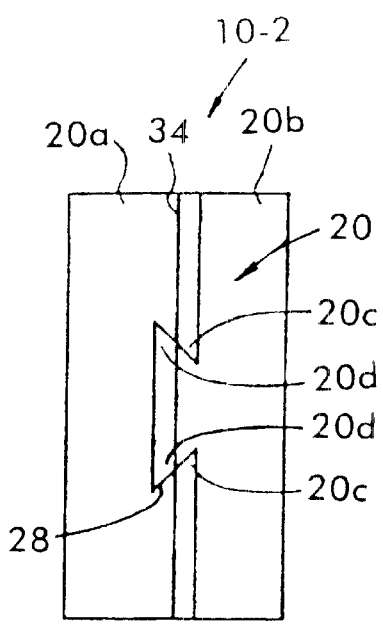
FIGS. 6A, 6B, 6C, 6D, and 6E are side views of shielded cases according to alternative embodiments of the present invention.

In the shielded case 10-2 shown in FIG. 6A, an elongated depression 34 is substituted for the round depressions 20 of the shielded case 10-1 of FIG. 1. The elongated depression 34 is formed as a linear groove disposed in the vicinity of the boundary between the half walls 20a, 20b so as to extend along mating parts 20c and 20d and pass through the Z-shaped interface 28 between the mating parts. As a result, the mating parts 20c and 20d are firmly coupled together with the Z-shaped interfaces 28 being pressure-welded together. The cross-sectional shape of the depression 21 may be take any suitable shape such as a curved groove.

Figure 6B:
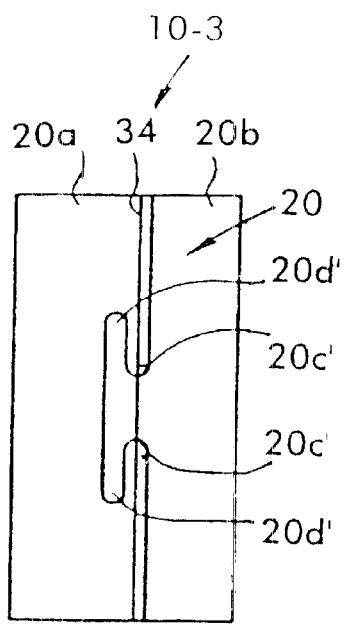

The mating parts 20c' and 20d' of the shielded case 10-3 shown in FIG. 6B have rounded edges, rather than the angled edges of the mating parts of the shielded case 10-2 shown in FIG. 6A. Like the embodiment of FIG. 6A, the shielded case 10-3 uses an elongated depression 34 to couple the half walls 20a, 20b together. The shielded case 10-3 offers substantially the same effect as that of the shielded case 10-2.

Figure 6C:
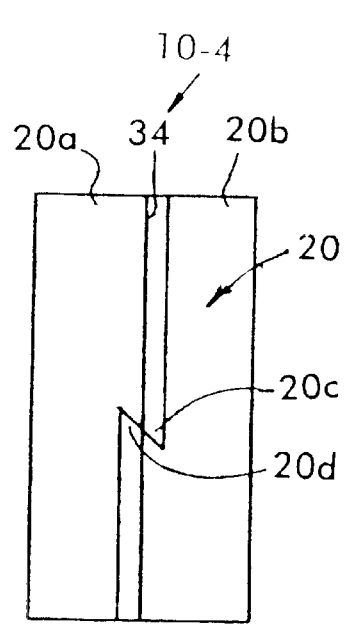

In the shielded case 10-4 shown in FIG. 6C, a single pair of mating parts 20c, 20d are used in lieu of two the pairs of mating parts used in the embodiment of FIG. 6A. Like the shielded case 10-2, the shielded case 10-4 uses an elongated depression to couple the mating parts together. The shielded case 10-4 offers substantially the same effect as that of the shielded case 10-2.

Figure 6D:
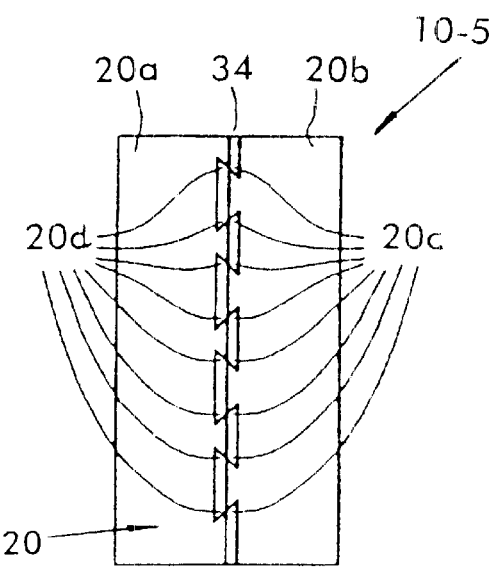

In the shielded case 10-5 shown in FIG. 6D, a plurality of mating parts 20c and 20d are provided and are pressure-welded together by the use of an elongated depression 34. The shielded case 10-5 offers substantially the same effect as that of the shielded case 10-2. However, because a greater number of overlapping areas are provided, a more secure coupling is achieved.

Figure 6E:
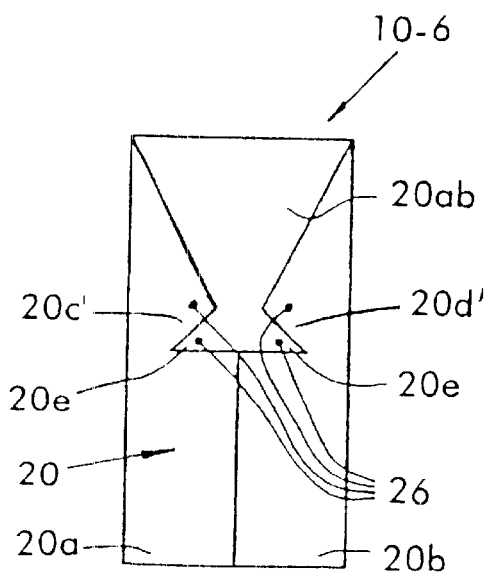

In the shielded case 10-6 shown in FIG. 6E, a portion of the side wall 20 is formed by side portion 12ab which is integral with and extends from the lateral edge of the top wall 12. The side portion 20ab is provided with mating parts 20e which couple with a mating parts 20c' and 20d'. The side portion 20ab is pressure welded to the half walls 20a, 20b by a plurality of depressions 26 formed therein. The shielded case 10-6 offers substantially the same effect as that of the shielded case 10-2.

As in the embodiment of FIG. 1, the half walls forming the side walls 18, 20 of the shielded cases 10-2, 10-3, 10-4, 10-5, and 10-6 do not separate from each other even when an impact is applied to the cases as with the prior embodiment. While the presence of the depressions in the side walls is usually sufficient to avoid separation between adjacent half walls, the abutting edges of the mating parts (or, if desired, the abutting edges of the entire length of the half walls) may be soldered so as to be more firmly coupled, if desired.

Figure 7A:
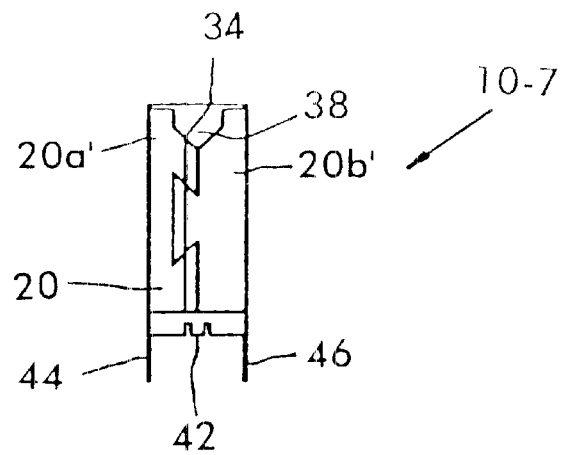
FIG. 7A is a side view of a shielded case according to another embodiment of the present invention.
Figure 7B:
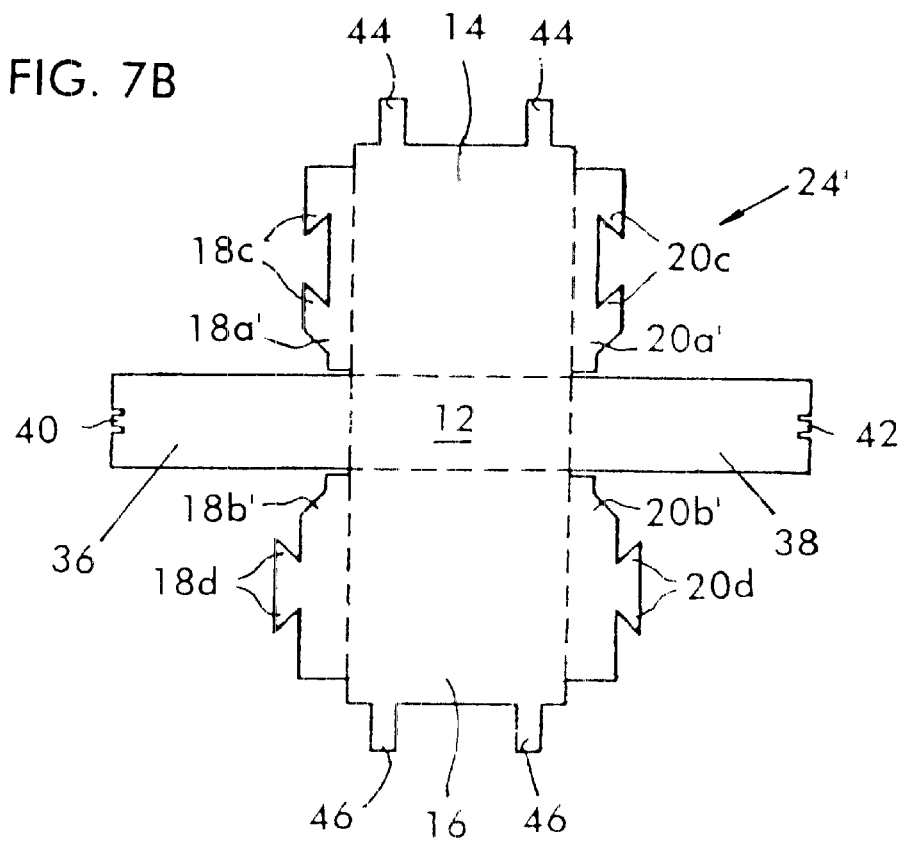
FIG. 7B is a development view of the blank form which the shielded case of FIG. 7A is formed.

FIG. 7A is an illustration of a shielded case 10-7 according to another embodiment of the present invention. FIG. 7B is a development view of a blank 24' from which the shielded case 10-7 is formed. In FIGS. 7A and 7B, components which are the same as or correspond to those of the shielded case 10-1 shown in FIG. 1 are identified by the same reference numerals and their description is omitted.

Referring to FIG. 7B, the shielded case is preferably formed from a flat blank 24' of ductile metal. Like the blank 24 of FIG. 3, the blank 24' includes the top wall 12, the front and rear walls 14 and 16 and half walls 18a', 18b', 20a' and 20b'. The half walls 18a', 18b', 20a' and 20b' have a slightly different shape than the half walls 18a, 18b, 20a and 20b of the embodiment of FIG. 3. Particularly, notches are formed in the half walls in the area adjacent the top wall 12.

The blank 24' also includes a pair of inner side walls 36, 38 which are integral with and extend laterally outwardly from the top wall 12. The inner side walls 36, 38 are longer than the length of the side walls 18, 20 and lie underneath and extend below the side walls 18, 20 when the blank 24' is bent to form the shielded case 10-7 (see FIG. 7A). The inner side walls 36 and 38 are provided with protrusions 40 and 42 formed at their distal edges, respectively. These protrusions are used to partially close the open bottom of the case 10-6 after an electronic element has been inserted into the case.

As best shown in FIG. 7B, the front and rear walls 14 and 16 are provided with mounting feet 44 and 46, respectively, which extend below the main body of the shielded case after the blank 24' has been folded into the shape of the case 10-7 as shown in FIG. 7A. These mounting feet are preferably used to mount the shielded case on a circuit board or other base. The mounting feet 44, 46 can, for example, be used to mount the shielded case to the circuit board by extending the feet through openings in the circuit board and bending the feet to lock the shielded case in place.

In order to form the sealed casing 10-7, the various walls and half walls of the blank 24' are bent at substantially right angles along the dashed lines shown in FIG. 7B and the mating portions are interlocked together. The inner side walls 36, 38 are placed under the side walls 18, 20, respectively, as best shown in FIG. 7A.

Because this embodiment uses the inner side walls 36, 38 underneath the side walls 18, 20, the electronic element inside the shielded case 10-7 will be shielded from electromagnetic waves even if there is a slight gap in the side walls 18, 20. Nonetheless, it is preferable to reliably pressure weld the mating parts of the side walls together using elongated depression 34.

Figure 8A:
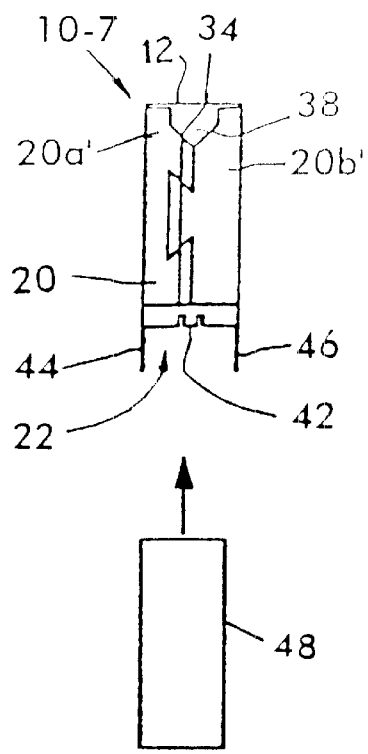
FIG. 8A is an exploded side view of an electronic device in which an electronic element is stored in the shielded case of FIG. 7A.
Figure 8B:
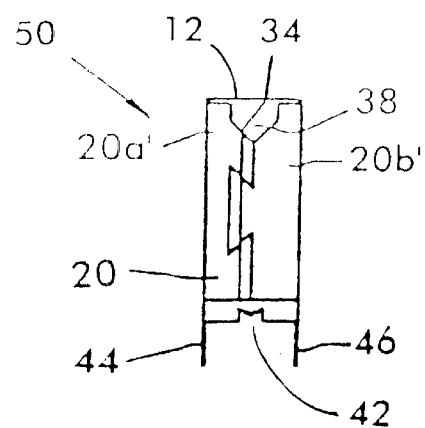
FIG. 8B is a side view of the electronic device of FIG. 8A with the electronic element housed in the shielded
Figure 10:
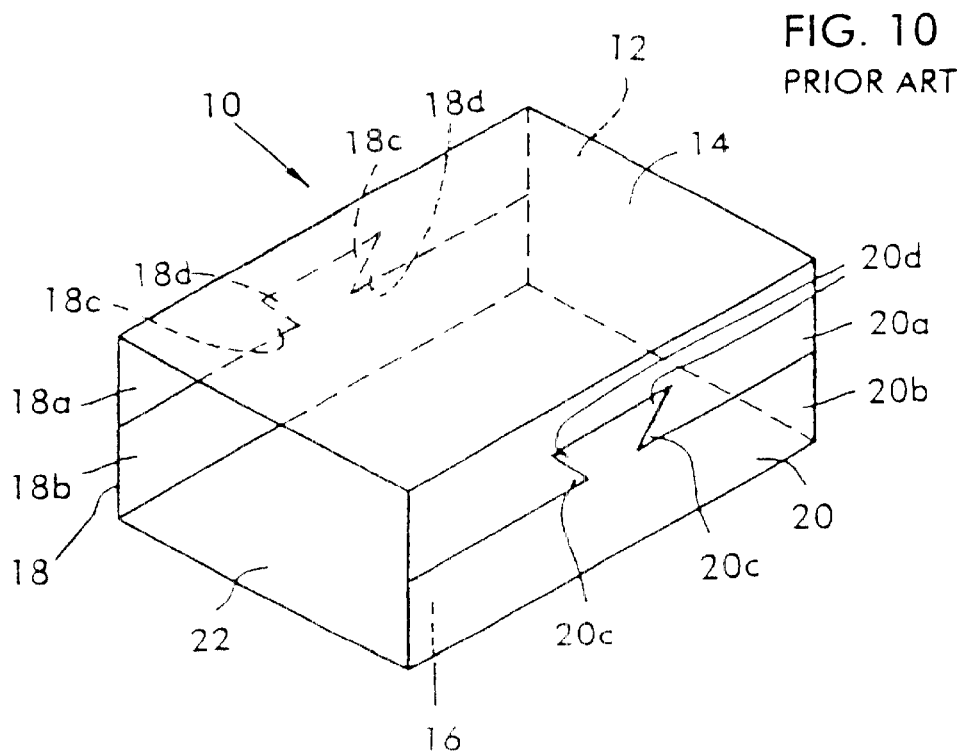
FIG. 10 is a perspective view of a known shielded case.

FIGS. 8A and 8B, show the manner in which an electronic element 48 can be housed in the shielded casing 10-7 to form a shielded electronic device 50 in accordance with the principals of the present invention.

FIG. 8A is an exploded view of the shielded electronic device 50 with the electronic element 48 located outside of the case 10-7. The electronic element 48 is inserted into the case 10-7 through the open bottom 22. Once the electronic element 48 has been inserted into the case 10-7, the protrusions 40, 42 (only protrusion 42 is shown in FIGS. 8A and 8B) are bent by approximately 90 degrees to partially close the case and prevent the electronic element from being removed, thereby forming the shielded electronic device 50 of FIG. 8B.

The electronic element 48 can be retained in the case 10-7 in any suitable manner. If desired, the protrusions 40, 42 can interact with the electronic device to lock it in place. Any other means can be used for this purpose.

In one example, the electronic device 50 is used as an oscillation gyro for determining angular velocities. Since the oscillation gyro includes an electronic element 48 which is easily affected by electromagnetic waves of an oscillating circuit and the like, the electronic element 48 is disposed in the shielded case 10-7 to inhibit transmission of the electromagnetic waves.

In the electronic device 50 of this embodiment, the inner side walls 36, 38 are disposed inside the side walls 18, 20, respectively. As a result, the electronic element 48 does not come into contact with the half walls forming the side walls 18, 20 when the electronic element 48 is inserted into the case 10-7. This reduces the likelihood that the half walls will separate from one another.

Figure 9:
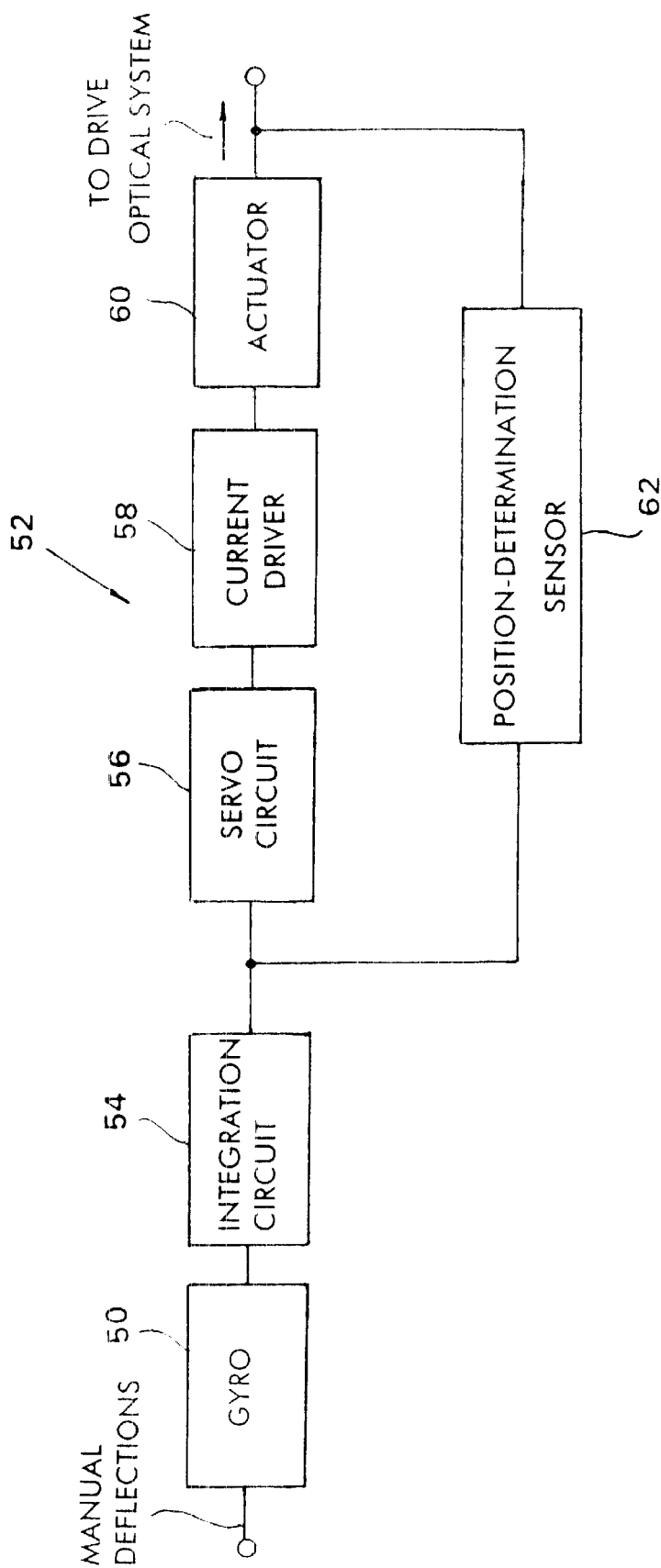
FIG. 9 is a block diagram of a circuit for avoiding the effects of manual movements of a camcorder using the shielded case of the present invention.

An electronic circuit 52 using an oscillation gyro as the shielded electronic device 50 is shown in FIG. 9. Circuit 52 is used in a camcorder to avoid the negative effect of manual deflections on the video being recorded by the camcorder. Circuit 52 includes oscillation gyro 50, an integration circuit 54, a servo circuit 56, a current driver 58, an actuator 60, and a position-determination sensor 62 connected to each other in series. The output of the actuator 60 is fed back to the servo circuit 56 via the position-determination sensor 62.

In this circuit, an angular-velocity-signal indicative of a manual deflection of the camcorder is generated by the oscillation gyro 50 and applied to the integration circuit 54. The integration circuit 54 integrates the angular-velocity-signal, converts it into a deflection angle, and outputs the deflection angle to the servo circuit 56. The servo circuit 56 computes the difference between an actual value of the deflection angle and a target value by using deflection-angle-signals inputted by the integration circuit 54 and the position-determination sensor 62, and outputs a computed difference signal to the current driver 58. The current driver 58 outputs electrical current to the actuator 60 according to the input signal, and the actuator 60 mechanically drives an optical system of the camcorder. The position-determination sensor 62 outputs the deflection angle produced by the optical system of the camcorder to the servo circuit 56. The electronic apparatus of the present invention can be used in any appropriate circuit and is not limited to the camcorder circuit having the above configuration.

The electronic apparatus according to the present invention is not likely to be broken because the electronic apparatus uses an electronic device in which a risk in that sidewalls of a shielded case remove from each other when an impact is applied and an electronic element received in the shielded case is exposed to the outside is avoided.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A shielded case comprising:
   a plurality of walls, at least one of the walls being formed by at least first and second separate sections which abut one another along respective opposed edges and do not overlap each other along respective opposed faces; and
   one or more depressions formed in at least one of the first and second sections so as to cause at least one of said sections to expand toward the other of said sections thereby pressure-welding said first and second sections along at least part of said respective opposed edges.

2. The shielded case according to claim 1, wherein each of said depressions is disposed in the vicinity of said at least part of said respective opposed edges.

3. The shielded case according to claim 2, wherein at least one of said depressions is an elongated depression.

4. The shielded case according to claim 3, wherein said elongated depression extends across both paid first and second sections.

5. The shielded case according to claim 1, wherein at least one of said depressions is circular in shape.

6. The shielded case according to claim 1, wherein said first and second sections are flat metallic plates.

7. The shielded case according to claim 1, wherein said first and second sections include at least one pair of mating parts which interlock with one another along said respective opposed edges and at least one of said depressions is formed in the area of said interlock.

8. The shielded case according to claim 7, wherein said mating parts abut one another along a Z-shaped edge.

9. A shielded electronic device comprising:
   (A) a shielded case comprising:
      (1) a plurality of walls, at least one of the walls being formed by at least first and second separate sections which abut one another along respective opposed edges and do not overlap each other along respective opposed faces; and
      (2) one or more depression formed in at least one of the first and second sections so as to cause at least one of said sections to expand toward the other of said sections thereby pressure-welding said first and second sections along at least part of said respective opposed edges; and
   (B) an electronic component located in said shielded case.

10. A method for manufacturing a shielded electronic device, said method comprising:
    forming a wall by bending first and second separate sections of a flat plate toward one another with opposed edges of said first and second sections abutting one another and opposed faces of said first and second sections not overlapping one another; and
    forming one or more depressions in said wall so that at least one of the first and second sections is expanded toward the other along at least a portion of said opposed edges of said sections to pressure weld said sections together.

11. An electronic circuit containing a plurality of components, at least one of said components being a shielded electronic device comprising:
    (A) a shielded case comprising:
       (1) a plurality of walls, at least one of the walls being formed by at least first and second separate sections which abut one another along respective opposed edges and do not overlap each other along respective opposed faces; and (2) one or more depression formed in at least one of the first and second sections so as to cause at least one of said sections to expand toward the other of said sections thereby pressure-welding said first and second sections along at least part of said respective opposed edges; and (B) an electronic component located in said shielded case.

* * * * *